(12) United States Patent
Fang et al.

(10) Patent No.: US 12,095,003 B2
(45) Date of Patent: Sep. 17, 2024

(54) MICRO LIGHT EMITTING DIODE CHIP

(71) Applicant: PlayNitride Display Co., Ltd., MiaoLi County (TW)

(72) Inventors: Hsin-Chiao Fang, MiaoLi County (TW); Jyun-De Wu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 401 days.

(21) Appl. No.: 17/489,799

(22) Filed: Sep. 30, 2021

(65) Prior Publication Data
US 2023/0008639 A1 Jan. 12, 2023

(30) Foreign Application Priority Data
Jul. 12, 2021 (TW) .................................. 110125431

(51) Int. Cl.
*H01L 33/14* (2010.01)
*H01L 33/00* (2010.01)
(Continued)

(52) U.S. Cl.
CPC ............ *H01L 33/14* (2013.01); *H01L 33/025* (2013.01); *H01L 33/0095* (2013.01);
(Continued)

(58) Field of Classification Search
CPC ....... H01L 33/025; H01L 33/14; H01L 33/20; H01L 33/305; H01L 33/40; H01L 33/382;
(Continued)

(56) References Cited

U.S. PATENT DOCUMENTS 9,006,775 B1 * 4/2015 Kuo ...................... H01L 33/382
257/98
10,164,152 B2 * 12/2018 Lin ......................... H01L 33/20
(Continued)

FOREIGN PATENT DOCUMENTS

CN 102569556 7/2012
CN 104681686 6/2015
(Continued)

OTHER PUBLICATIONS

"Office Action of China Counterpart Application", issued on Mar. 9, 2023, pp. 1-7.
(Continued)

*Primary Examiner* — Jaehwan Oh
*Assistant Examiner* — John M Parker
(74) *Attorney, Agent, or Firm* — JCIPRNET (57) ABSTRACT

A micro light emitting diode chip including a first-type semiconductor layer, an active layer, a second-type semiconductor layer, a first-type electrode, and a second-type electrode is provided. The first-type semiconductor layer has a first high-concentration doping region and a first low-concentration doping region. The active layer is disposed between the first-type semiconductor layer and the second-type semiconductor layer. The first-type electrode is directly contacted and electrically connected to the first high-concentration doping region. The second-type electrode is electrically connected to the second-type semiconductor layer.

15 Claims, 3 Drawing Sheets

(51) Int. Cl.
*H01L 33/02* (2010.01)
*H01L 33/30* (2010.01)
*H01L 33/38* (2010.01)
*H01L 33/40* (2010.01)

(52) U.S. Cl.
CPC .......... *H01L 33/305* (2013.01); *H01L 33/382* (2013.01); *H01L 33/40* (2013.01); *H01L 2933/0016* (2013.01)

(58) Field of Classification Search
CPC ......... H01L 33/0095; H01L 2933/0016; H01L 25/0753
See application file for complete search history.

(56) References Cited

U.S. PATENT DOCUMENTS

| | | | | |
|---|---|---|---|---|
| 10,490,720 | B2* | 11/2019 | Li | H01L 33/382 |
| 11,309,457 | B2* | 4/2022 | Jeon | H01L 33/387 |
| 2005/0179045 | A1 | 8/2005 | Ryu et al. | |
| 2018/0166606 | A1* | 6/2018 | Lin | H01L 33/20 |
| 2021/0057611 | A1 | 2/2021 | Guo et al. | |

FOREIGN PATENT DOCUMENTS

| | | |
|---|---|---|
| CN | 108475715 | 8/2018 |
| CN | 110828557 | 2/2020 |
| TW | 200610175 | 3/2006 |
| TW | I478387 | 3/2015 |
| TW | 201822380 | 6/2018 |
| TW | I632673 | 8/2018 |

OTHER PUBLICATIONS

"Office Action of Taiwan Counterpart Application", issued on Dec. 28, 2021, p. 1-p. 6.

"Office Action of China Counterpart Application", issued on Oct. 28, 2022, p. 1-p. 8.

* cited by examiner

MICRO LIGHT EMITTING DIODE CHIP

CROSS-REFERENCE TO RELATED APPLICATION

This application claims the priority benefit of Taiwanese application serial no. 110125431, filed on Jul. 12, 2021. The entirety of the above-mentioned patent application is hereby incorporated by reference herein and made a part of this specification.

BACKGROUND

Technical Field

The disclosure relates to a chip, in particular to a micro light emitting diode chip.

Description of Related Art

In the existing manufacture of the micro light emitting diode chip such as a red micro light emitting diode chip, the final process requires the electrode and the epitaxial structure to make ohmic contact, such as Be—Au alloy electrode and the epitaxial structure of the P-type-window layer to make ohmic contact. Before making the ohmic contact between the electrode and the epitaxial structure, the transparent substrate is usually bonded to the epitaxial structure using polymer glue, for example, the transparent substrate is bonded to the P-type window layer. However, the temperature at which the electrode and the epitaxial structure make ohmic contact is about 500 degrees Celsius, and this temperature may cause the polymer glue to break, which in turn may cause the chip to break.

SUMMARY

The disclosure provides a micro light emitting diode chip capable of making ohmic contact between an electrode and an epitaxial structure at a relatively low temperature.

An embodiment of the disclosure provides a micro light emitting diode chip including a first-type semiconductor layer, an active layer, a second-type semiconductor layer, a first-type electrode, and a second-type electrode. The first-type semiconductor layer has a first high-concentration doping region and a first low-concentration doping region. The active layer is disposed between the first-type semiconductor layer and the second-type semiconductor layer. The first-type electrode is directly contacted and electrically contacted to the first high-concentration doping region. The second-type electrode is electrically connected to the second-type semiconductor layer.

According to an embodiment of the disclosure, doping concentration of the first high-concentration doping region falls within a range of $5\times10^{17}$ cm$^{-3}$ to $1\times10^{19}$ cm$^{-3}$.

According to an embodiment of the disclosure, a ratio of an area of an orthographic projection of the first high-concentration doping region in a direction perpendicular to the micro light emitting diode chip to an area of an orthographic projection of the micro light emitting diode chip in the direction falls within a range of 0.01 to 0.35.

According to an embodiment of the disclosure, a ratio of an area of an orthographic projection of a first contact region in a direction perpendicular to the micro light emitting diode chip to an area of an orthographic projection of the first high-concentration doping region in the direction falls within a range of 0.5 to 1. The first contact region is a contact range of the first-type electrode and the first high-concentration doping region.

According to an embodiment of the disclosure, a thickness of the first high-concentration doping region falls within a range of 1 nm to 3 μm.

According to an embodiment of the disclosure, a distance between the first high-concentration doping region and the active layer falls within a range of 0.5 μm to 1.5 μm.

According to an embodiment of the disclosure, a shortest distance between the first-type electrode and an edge of the micro light emitting diode chip is greater than or equal to 1 μm.

According to an embodiment of the disclosure, a shortest distance between the first high-concentration doping region and an edge of the micro light emitting diode chip is greater than or equal to 1 μm.

According to an embodiment of the disclosure, the micro light emitting diode chip further includes a window layer. The first-type semiconductor layer is disposed between the active layer and the window layer.

According to an embodiment of the disclosure, a ratio of doping concentration of the first high-concentration doping region to doping concentration of the window layer is greater than or equal to 3 and less than or equal to 1000.

According to an embodiment of the disclosure, the first-type electrode includes an upper first-type electrode. The upper first-type electrode is disposed on a surface of the window layer away from the first-type semiconductor layer. In a direction of the first-type semiconductor layer perpendicular to the micro light emitting diode chip, a first overlapping region exists between an orthographic projection of the upper first-type electrode onto the first high-concentration doping region and the first high-concentration doping region. An area ratio of the first overlapping region to the first high-concentration doping region falls within a range of 0.5 to 1.5.

According to an embodiment of the disclosure, the first-type electrode includes an upper first-type electrode. The upper first-type electrode is disposed on a surface of the second-type semiconductor layer away from the first-type semiconductor layer. In a direction perpendicular to the micro light emitting diode chip, a first overlapping region exists between an orthographic projection of the upper first-type electrode onto the first high-concentration doping region and the first high-concentration doping region. An area ratio of the first overlapping region to the first high-concentration doping region falls within a range of 0.5 to 1.5.

According to an embodiment of the disclosure, the second-type semiconductor layer has a second high-concentration doping region and a second low-concentration doping region. The second-type electrode is directly contacted and electrically contacted to the second high-concentration doping region.

According to an embodiment of the disclosure, doping concentration of the second high-concentration doping region falls within a range of $5\times10^{17}$ cm$^{-3}$ to $1\times10^{19}$ cm$^{-3}$.

According to an embodiment of the disclosure, a ratio of an area of an orthographic projection of the second high-concentration doping region along a direction perpendicular to the micro light emitting diode chip to an area of an orthographic projection of the micro light emitting diode chip in the direction falls within a range of 0.01 to 0.35.

According to an embodiment of the disclosure, a ratio of an area of an orthographic projection of a second contact region in a direction perpendicular to the micro light emitting diode chip to an area of the second high-concentration doping region falls within a range of 0.5 to 1. The second contact region is a contact range of the second-type electrode and the second high-concentration doping region.

According to an embodiment of the disclosure, a thickness of the second high-concentration doping region falls within a range of 1 nm to 3 μm.

According to an embodiment of the disclosure, a distance between the second high-concentration doping region and the active layer falls within a range of 0.5 μm to 1.5 μm.

According to an embodiment of the disclosure, a shortest distance between the second-type electrode and an edge of the micro light emitting diode chip is greater than or equal to 1 μm.

According to an embodiment of the disclosure, a shortest distance between the second high-concentration doping region and an edge of the micro light emitting diode chip is greater than or equal to 1 μm.

Based on the above, in the micro light emitting diode chip according to an embodiment of the disclosure, the first-type semiconductor layer has a first high-concentration doping region or the second-type semiconductor layer has a second high-concentration doping region. Therefore, the first-type electrode and the first high-concentration doping region or the second-type electrode and the second high-concentration doping region may be annealed at low temperature to reach ohmic contact temperature, which further prevents polymer glue from breaking and increases the yield.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
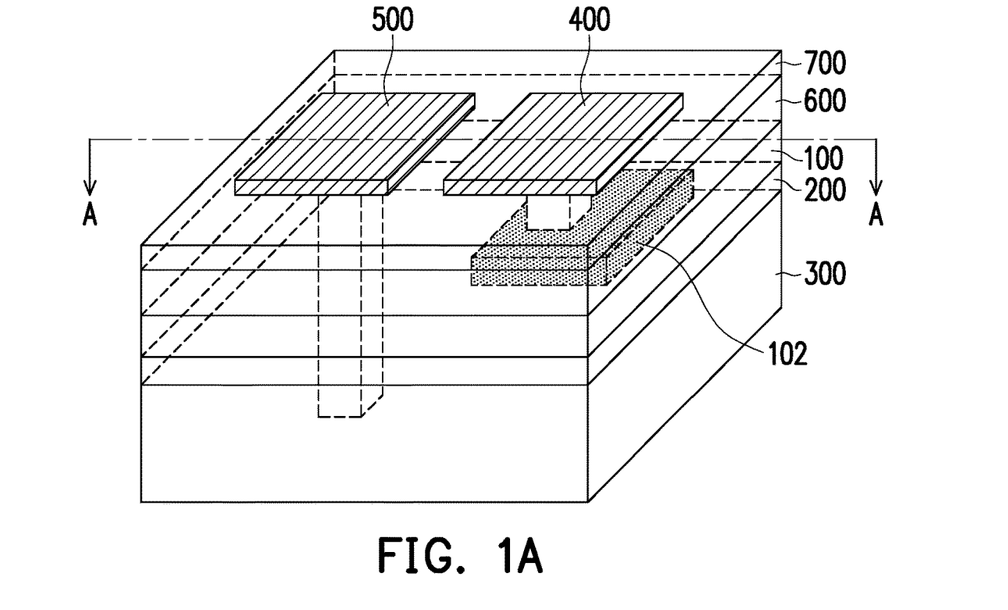
FIG. 1A is a schematic three-dimensional view of a micro light emitting diode chip according to a first embodiment of the disclosure.
Figure 1B:
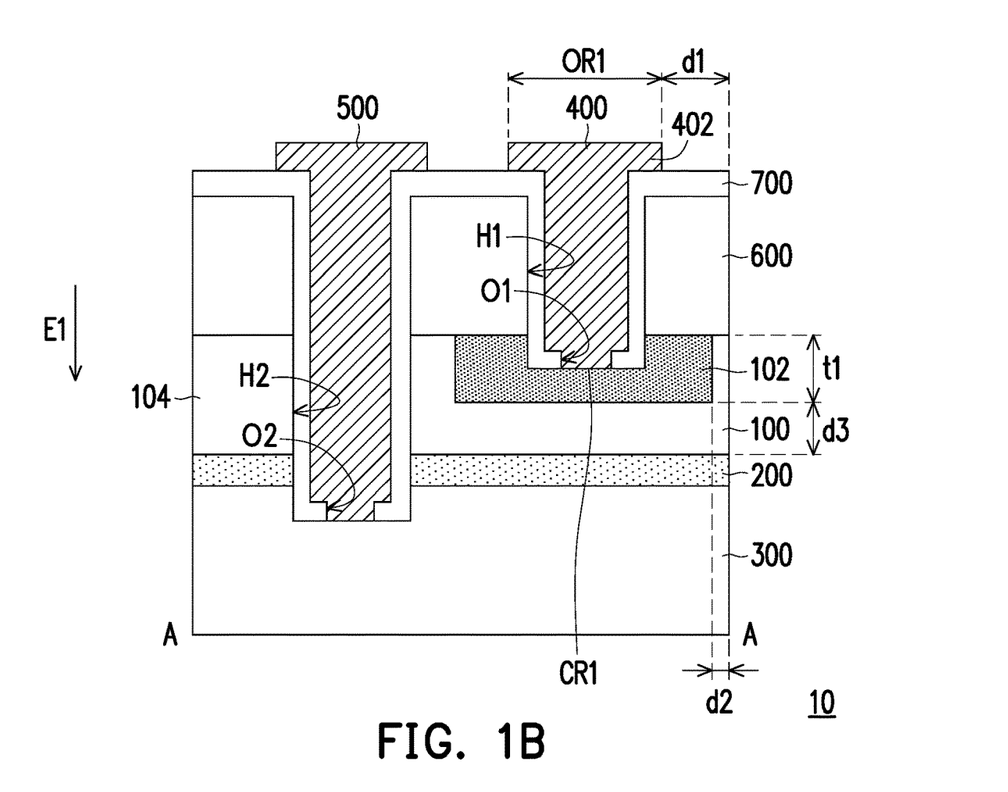
FIG. 1B is a schematic cross-sectional view of the micro light emitting diode chip according to the first embodiment of the disclosure.

FIG. 1A is a schematic three-dimensional view of a micro light emitting diode chip according to a first embodiment of the disclosure. FIG. 1B is a schematic cross-sectional view of the micro light emitting diode chip according to the first embodiment of the disclosure. Referring to FIG. 1A and FIG. 1B, an embodiment of the disclosure provides a micro light emitting diode chip 10, which includes a first-type semiconductor layer 100, an active layer 200, a second-type semiconductor layer 300, a first-type electrode 400, and a second-type electrode 500.

According to this embodiment, the first-type semiconductor layer 100 may be a P-type (or N-type) semiconductor layer, and the second-type semiconductor layer 300 may be an N-type (or P-type) semiconductor layer. In the present embodiment, the first-type semiconductor layer 100 is a P-type semiconductor layer, dopant thereof is, for example, carbon (C), magnesium (Mg), zinc (Zn), selenium (Se), or beryllium (Be). And the second-type semiconductor layer 300 is an N-type semiconductor layer, dopant thereof is, for example, silicon (Si) or tellurium (Te). In the embodiment, the micro light emitting diode chip 10 is, for instance, a red light microLED or an infrared light microLED chip, while the disclosure is not limited thereto.

According to this embodiment, a structure of the active layer 200 may be a multiple quantum well (MQW) structure, a single quantum well structure, a double heterostructure, a single heterostructure, or a combination thereof. A material of the active layer 200 may be a semiconductor material of gallium phosphide system.

According to this embodiment, a material of the first-type electrode 400 or the second-type electrode 500 is, for example, a Be—Au alloy, but the disclosure is not limited thereto.

According to this embodiment, the first-type semiconductor layer 100 has a first high-concentration doping region 102 and a first low-concentration doping region 104. When doping concentration of the high-concentration doping region is too low, resistance will increase; when the doping concentration of the high-concentration doping region is too high, transparency of the micro light emitting diode chip 10 will decrease. According to this embodiment, the doping concentration of the first high-concentration doping region 102 falls within a range of $5\times10^{17}$ cm$^{-3}$ to $1\times10^{19}$ cm$^{-3}$. According to a preferred embodiment, the doping concentration of the first high-concentration doping region 102 falls within a range of $5\times10^{18}$ cm$^{-3}$ to $1\times10^{19}$ cm$^{-3}$, which may allow for better resistivity and transparency.

According to this embodiment, the active layer 200 is disposed between the first-type semiconductor layer 100 and the second-type semiconductor layer 300. The first-type electrode 400 is directly contacted and electrically connected to the first high-concentration doping region 102. The second-type electrode 500 is electrically connected to the second-type semiconductor layer 300.

According to this embodiment, a ratio of an area of an orthographic projection of the first high-concentration doping region 102 in a direction E1 perpendicular to the micro light emitting diode chip 10 to an area of an orthographic projection of the micro light emitting diode chip 10 in the direction E1 falls within a range of 0.01 to 0.35.

According to this embodiment, a ratio of an area of an orthographic projection of a first contact region CR1 in the direction E1 perpendicular to the micro light emitting diode chip 10 to an area of an orthographic projection of the first high-concentration doping region 102 in the direction E1 falls within a range of 0.5 to 1. The first contact region CR1 is a contact range of the first-type electrode 400 and the first high-concentration doping region 102. According to relationship between resistance R and area A: $R=\rho\times l/A$, when an area of the first contact region CR1 is large, the resistance R is relatively small, and high doping helps current diffusion, where ρ is resistivity of the material and l is resistance length.

According to this embodiment, a thickness t1 of the first high-concentration doping region 102 falls within a range of 1 nm to 3 μm. When the thickness t1 of the first high-concentration doping region 102 is too small, the first high-concentration doping region 102 makes a depth of current diffusion difficult to control, and an effect of current diffusion may be lost. Conversely, considering that a thickness of the first-type semiconductor layer 100 is thicker than 3 μm, for example, designed to fall within a range of 4 μm to 5 μm, the thickness t1 of the first high-concentration doping region 102 is too thick, and the first high-concentration doping region 102 will affect a current path and may produce a light absorption effect.

According to this embodiment, a distance d3 between the first high-concentration doping region 102 and the active layer 200 falls within a range of 0.5 μm to 1.5 μm. When the distance d3 between the first high-concentration doping region 102 and the active layer 200 is too small, impurities will easily diffuse into the active layer 200 and affect a photoelectric effect of the micro light emitting diode chip 10. Conversely, when the distance d3 between the first high-concentration doping region 102 and the active layer 200 is too large, referring to FIG. 2 or FIG. 3, an etching depth of a groove H1 is too deep, resulting in poor yield of the micro light emitting diode chip 10 and poor distribution efficiency of current in the first high-concentration doping region 102 and the first semiconductor layer 100, reducing photoelectric efficiency.

According to this embodiment, a shortest distance d1 between the first-type electrode 400 and an edge of the micro light emitting diode chip 10 is greater than or equal to 1 μm. Moreover, a shortest distance d2 between the first high-concentration doping region 102 and the edge of the micro light emitting diode chip 10 is greater than or equal to 1 μm. In this way, the first-type electrode 400 may be configured toward a center of the micro light emitting diode chip 10, which may increase bonding yield and avoid a sidewall effect of carriers running to sidewalls.

According to this embodiment, the micro light emitting diode chip 10 further includes a window layer 600. The window layer 600 is configured as a light extraction layer. A substrate of the window layer 600 may be a group III-V material, and the doping may be the same as the first-type semiconductor layer 100. In addition, the first-type semiconductor layer 100 is disposed between the active layer 200 and the window layer 600.

According to this embodiment, a ratio of the doping concentration of the first high-concentration doping region 102 to doping concentration of the window layer 600 is greater than or equal to 3 and less than or equal to 1000; if the ratio is less than 3, the window layer 600 will absorb light due to its high doping concentration; if the ratio is greater than 1000, the yield of the chip is not good due to the low doping concentration of the window layer 600. According to a preferred embodiment, the ratio of the doping concentration of the first high-concentration doping region 102 to the doping concentration of the window layer 600 is greater than or equal to 10 and less than or equal to 50.

According to this embodiment, the first-type electrode 400 includes an upper first-type electrode 402. The upper first-type electrode 402 is disposed on a surface of the window layer 600 away from the first-type semiconductor layer 100. In the direction E1 of the first-type semiconductor layer 100 perpendicular to the micro light emitting diode chip 10, a first overlapping region OR1 exists between an orthographic projection of the upper first-type electrode 402 onto the first high-concentration doping region 102 and the first high-concentration doping region 102. Furthermore, when an area ratio of the first overlapping region OR1 to the first high-concentration doping region 102 falls within a range of 0.5 to 1.5, the first-type electrode 400 may be configured toward the center of the micro light emitting diode chip 10 to increase bonding area, which may increase the bonding yield and avoid the sidewall effect of carriers running to the sidewalls.

According to this embodiment, the micro light emitting diode chip 10 further has a first groove H1 and a second groove H2. The first groove H1 penetrates the window layer 600 and a part of the first high-concentration doping region 102, and the first groove H1 exposes a surface of the first high-concentration doping region 102 on a side opposite to the direction E1. In addition, the first-type electrode 400 is disposed in the first groove H1 and electrically contacts the exposed surface of the first high-concentration doping region 102. Moreover, the second groove H2 penetrates the window layer 600, the first-type semiconductor layer 100, the active layer 200 and a part of the second-type semiconductor layer 300, and the second groove H2 exposes a surface of the second-type semiconductor layer 300 on a side opposite to the direction E1. Furthermore, the second-type electrode 500 is disposed in the second groove H2 and electrically contacts the exposed surface of the second-type semiconductor layer 300.

According to this embodiment, the micro light emitting diode chip 10 further includes an insulating layer 700. The insulating layer 700 covers inner walls of the first groove H1 and the second groove H2, making the first-type electrode 400 be electrically insulated from the window layer 600, and the second-type electrode 500 be electrically insulated from the window layer 600, the first-type semiconductor layer 100, and the active layer 200. Moreover, the insulating layer 700 is extended and disposed on a surface of the window layer 600 on a side opposite to the direction E1.

In addition, according to this embodiment, the insulating layer 700 has a first opening O1 and a second opening O2 in the first groove H1 and the second groove H2, respectively, and the first-type electrode 400 and the second-type electrode 500 are electrically contacted through the first opening O1 and the second opening O2 to the first high-concentration doping region 102 and the second-type semiconductor layer 300, respectively.

Based on the above, in the micro light emitting diode chip 10 according to an embodiment of the disclosure, the first-type semiconductor layer 100 has the first high-concentration doping region 102, and the first-type electrode 400 is electrically contacted to the first high-concentration doping region 102. Therefore, the first-type electrode 400 and the first high-concentration doping region 102 may be annealed at low temperature to reach ohmic contact temperature (falling in a range of 400 to 500 degrees Celsius), which further prevents polymer glue from breaking and increases the yield.

Figure 2:
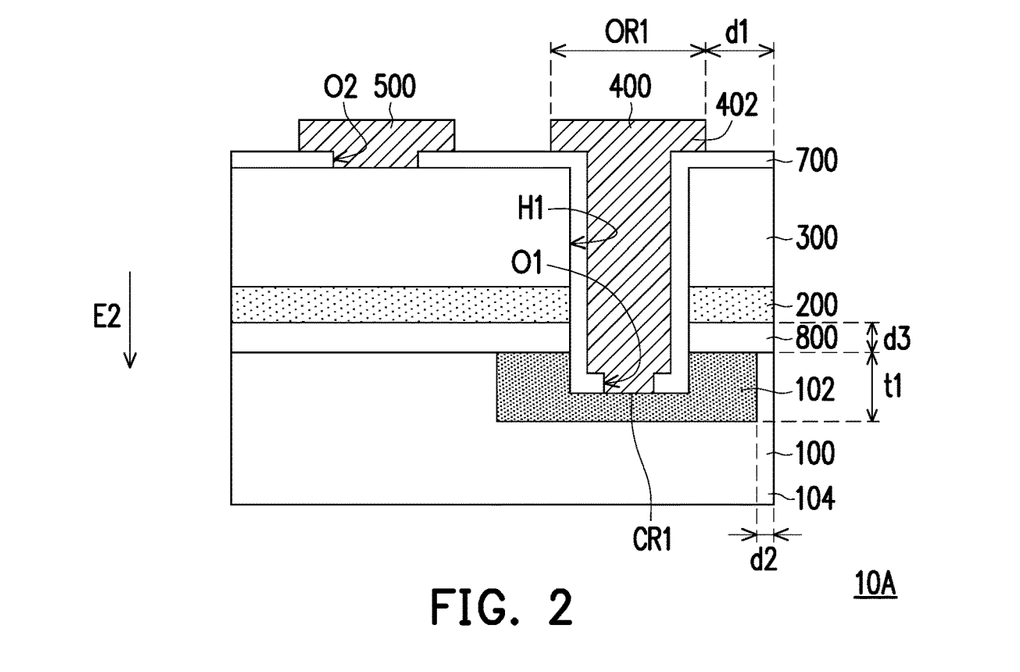
FIG. 2 is a schematic cross-sectional view of a micro light emitting diode chip according to a second embodiment of the disclosure.

FIG. 2 is a schematic cross-sectional view of a micro light emitting diode chip according to a second embodiment of the disclosure. Referring to FIG. 2, a micro light emitting diode chip 10A according to this embodiment is similar to the micro light emitting diode chip 10 of FIG. 1B, with the following major differences. According to this embodiment, the micro light emitting diode chip 10A further includes a buffer layer 800. A material of the buffer layer 800 may be a group III-V material, and the doping may be the same as the first-type semiconductor 100. The buffer layer 800 is disposed between the active layer 200 and the first-type semiconductor layer 100. The buffer layer 800 between the first high-concentration doping region 102 and the active layer 200 could avoid the impurities of the first high-concentration doping region 102 from diffusing into the active layer 200 and affecting a photoelectric effect of the micro light emitting diode chip 10B.

According to this embodiment, the first-type electrode 400 includes an upper first-type electrode 402. The upper first-type electrode 402 is disposed on a surface of the second-type semiconductor layer 300 away from the first-type semiconductor layer 100. In a direction E2 perpendicular to the micro light emitting diode chip 10A, a first overlapping region OR1 exists between an orthographic projection of the upper first-type electrode 402 onto the first high-concentration doping region 102 and the first high-concentration doping region 102. An area ratio of the first overlapping region OR1 to the first high-concentration doping region 102 falls within a range of 0.5 to 1.5.

In addition, according to this embodiment, the micro light emitting diode chip 10A does not have the second groove H2 of the micro light emitting diode chip 10 of FIG. 1B. Furthermore, the first groove H1 penetrates the second-type semiconductor layer 300, the active layer 200, the buffer layer 800 and a part of the first high-concentration doping region 102, and the first groove H1 exposes a surface of the first high-concentration doping region 102 on a side opposite to the direction E2. Moreover, the first-type electrode 400 is disposed in the first groove H1 and electrically contacts the exposed surface of the first high-concentration doping region 102. Advantages of the micro light emitting diode chip 10A are similar to those of the micro light emitting diode chip 10 and therefore will not be repeated in the following.

Figure 3:
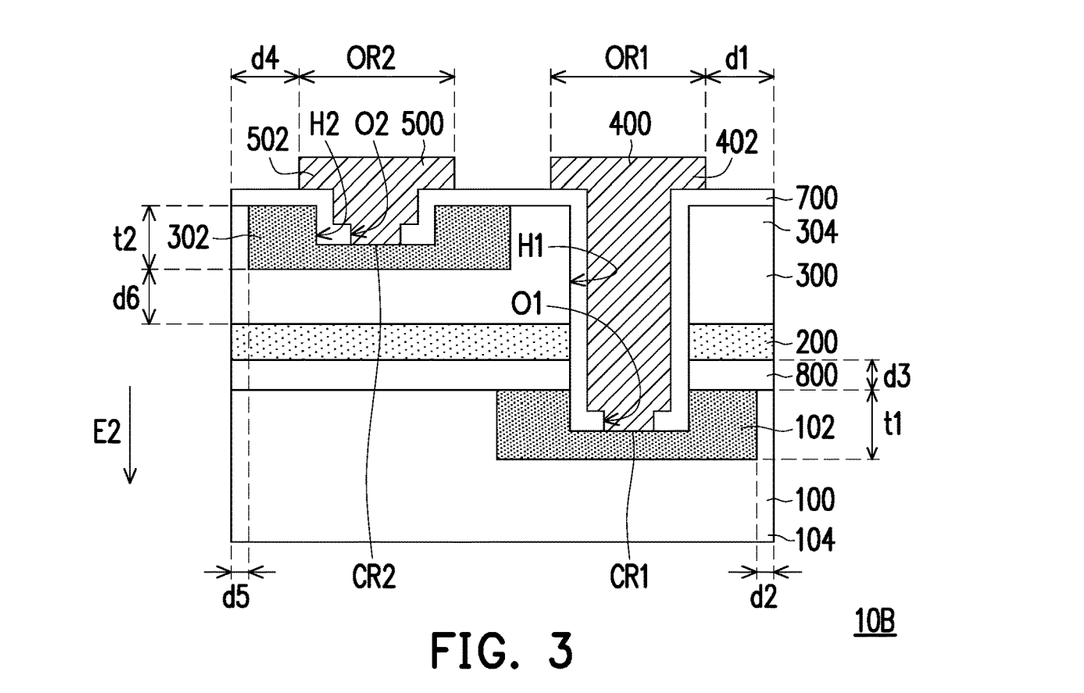
FIG. 3 is a schematic cross-sectional view of a micro light emitting diode chip according to a third embodiment of the disclosure.

FIG. 3 is a schematic cross-sectional view of a micro light emitting diode chip according to a third embodiment of the disclosure. Referring to FIG. 3, a micro light emitting diode chip 10B according to this embodiment is similar to the micro light emitting diode chip 10A of FIG. 2, with the following major differences. According to this embodiment, the second-type semiconductor layer 300 has a second high-concentration doping region 302 and a second low-concentration doping region 304. The second-type electrode 500 is directly contacted and electrically connected to the second high-concentration doping region 302. Doping concentration of the second high-concentration doping region 302 falls within a range of $5 \times 10^{17}$ cm$^{-3}$ to $1 \times 10^{19}$ cm$^{-3}$. According to a preferred embodiment, the doping concentration of the second high-concentration doping region 302 falls within a range of $5 \times 10^{18}$ cm$^{-3}$ to $1 \times 10^{19}$ cm$^{-3}$.

According to this embodiment, a ratio of an area of an orthographic projection of the second high-concentration doping region 302 along the direction E2 to an area of an orthographic projection of the micro light emitting diode chip 10B in the direction E2 falls within a range of 0.01 to 0.35.

According to this embodiment, a ratio of an area of an orthographic projection of a second contact region CR2 in the direction E2 to an area of the second high-concentration doping region 302 falls within a range of 0.5 to 1. The second contact area CR2 is a contact range of the second-type electrode 500 and the second high-concentration doping region 302. When an area of the second contact region CR2 is large, the resistance R is relatively small, and high doping helps current diffusion.

According to this embodiment, a thickness t2 of the second high-concentration doping region 302 falls within a range of 1 nm to 3 μm. When the thickness t2 of the second high-concentration doping region 302 is too small, the second high-concentration doping region 302 makes a depth of current diffusion difficult to control, and an effect of current diffusion may be lost. Conversely, considering that a thickness of the second-type semiconductor layer 300 is thicker than 3 μm, for example, designed to fall within a range of 4 μm to 5 μm, the thickness t2 of the second high-concentration doping region 302 is too thick, and the second high-concentration doping region 302 will affect a current path and may produce a light absorption effect.

According to this embodiment, a distance d6 between the second high-concentration doping region 302 and the active layer 200 falls within a range of 0.5 μm to 1.5 μm. When the distance d6 between the second high-concentration doping region 302 and the active layer 200 is too small, impurities will easily diffuse into the active layer 200 and affect a photoelectric effect of the micro light emitting diode chip 10B. Conversely, when the distance d6 between the second high-concentration doping region 302 and the active layer 200 is too large, the distribution efficiency of current is poor.

According to this embodiment, a shortest distance d4 between the second-type electrode 500 and an edge of the micro light emitting diode chip 10B is greater than or equal to 1 μm. Moreover, a shortest distance d5 between the second high-concentration doping region 302 and the edge of the micro light emitting diode chip 10B is greater than or equal to 1 μm. In this way, the second-type electrode 500 may be configured toward a center of the micro light emitting diode chip 10B, which may increase bonding yield and avoid a sidewall effect of carriers running to sidewalls.

According to this embodiment, the second-type electrode 500 includes an upper second-type electrode 502. The upper second-type electrode 502 is disposed on a surface of the second-type semiconductor layer 300 away from the first-type semiconductor layer 100. A second overlapping region OR2 exists between an orthographic projection of the upper second-type electrode 502 in the direction E2 and the second high-concentration doping region 302. Furthermore, when an area ratio of the second overlapping region OR2 to the second high-concentration doping region 302 falls within a range of 0.5 to 1.5, the second-type electrode 500 may be configured toward the center of the micro light emitting diode chip 10B, which may increase the bonding yield and avoid the sidewall effect of carriers running to the sidewalls.

In addition, the micro light emitting diode chip 10B further has a second groove H2. The second groove H2 penetrates a part of the second high-concentration doping region 302, and the second groove H2 exposes a surface of the second high-concentration doping region 302 on a side opposite to the direction E2. Moreover, the second-type electrode 500 is disposed in the second groove H2 and electrically contacts the exposed surface of the second high-concentration doping region 302. Advantages of the micro light emitting diode chip 10B are similar to those of the micro light emitting diode chip 10A or 10 and therefore will not be repeated in the following.

Figure 4:
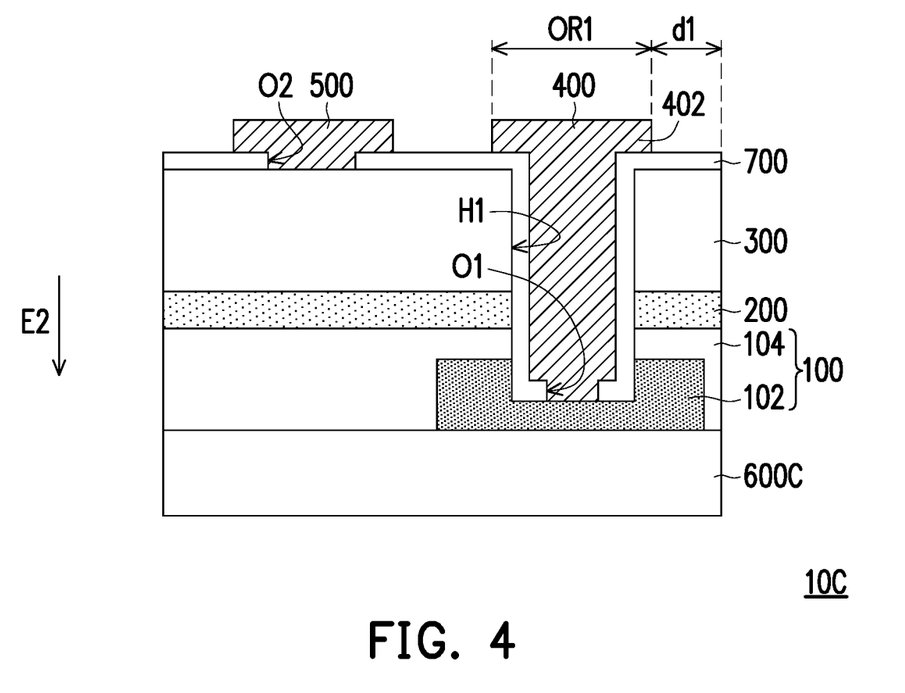
FIG. 4 is a schematic cross-sectional view of the micro light emitting diode chip according to a fourth embodiment of the disclosure.

FIG. 4 is a schematic cross-sectional view of the micro light emitting diode chip according to a fourth embodiment of the disclosure. Referring to FIG. 4, a micro light emitting diode chip 10C according to this embodiment is similar to the micro light emitting diode chip 10A of FIG. 2, with the following major differences. In the micro light emitting diode chip 10C in this embodiment, the window layer 600C is located at the light output surface to serve as a light extraction layer of the micro light emitting diode chip 10C. In this embodiment, the first semiconductor layer 100 is disposed between the window layer 600C and the active layer 200. Moreover, the window layer 600C serves as a layer to be bonded to a transfer substrate (not shown) before forming ohmic contact between the electrode and the epitaxial structure, so as to prevent the transfer substrate (not shown) from being in direct contact with the first semiconductor layer 100 to affect the yield.

In summary, in the micro light emitting diode chip according to an embodiment of the disclosure, the first-type semiconductor layer has a first high-concentration doping region or the second-type semiconductor layer has a second high-concentration doping region. The first-type electrode is electrically connected to the first high-concentration doping region or the second-type electrode is electrically connected to the second high-concentration doping region. Therefore, the first-type electrode and the first high-concentration doping region or the second-type electrode and the second high-concentration doping region may be annealed at low temperature to reach ohmic contact temperature, which further prevents polymer glue from breaking and increases the yield.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A micro light emitting diode chip comprising:
    a first-type semiconductor layer having a first high-concentration doping region and a first low-concentration doping region;
    an active layer;
    a second-type semiconductor layer, wherein the active layer is disposed between the first-type semiconductor layer and the second-type semiconductor layer;
    a first-type electrode directly contacted and electrically connected to the first high-concentration doping region; and
    a second-type electrode electrically connected to the second-type semiconductor layer,
    wherein a ratio of an area of an orthographic projection of a first contact region in a direction perpendicular to the micro light emitting diode chip to an area of an orthographic projection of the first high-concentration doping region in the direction falls within a range of 0.5 to 1, and the first contact region is a contact range of the first-type electrode and the first high-concentration doping region.

2. The micro light emitting diode chip according to claim 1, wherein doping concentration of the first high-concentration doping region falls within a range of $5\times10^{17}$ cm$^{-3}$ to $1\times10^{19}$ cm$^{-3}$.

3. The micro light emitting diode chip according to claim 1, wherein a ratio of an area of an orthographic projection of the first high-concentration doping region in a direction perpendicular to the micro light emitting diode chip to an area of an orthographic projection of the micro light emitting diode chip in the direction falls within a range of 0.01 to 0.35.

4. The micro light emitting diode chip according to claim 1, wherein a thickness of the first high-concentration doping region falls within a range of 1 nm to 3 μm.

5. The micro light emitting diode chip according to claim 1, wherein a distance between the first high-concentration doping region and the active layer falls within a range of 0.5 μm to 1.5 μm.

6. The micro light emitting diode chip according to claim 1, wherein a shortest distance between the first high-concentration doping region and an edge of the micro light emitting diode chip is greater than or equal to 1 μm.

7. The micro light emitting diode chip according to claim 1 further comprising a window layer, wherein the first-type semiconductor layer is disposed between the active layer and the window layer.

8. The micro light emitting diode chip according to claim 7, wherein a ratio of doping concentration of the first high-concentration doping region to doping concentration of the window layer is greater than or equal to 3 and is less than or equal to 1000.

9. The micro light emitting diode chip according to claim 7, wherein the first-type electrode comprises an upper first-type electrode disposed on a surface of the window layer away from the first-type semiconductor layer,
    wherein in a direction of the first-type semiconductor layer perpendicular to the micro light emitting diode chip, a first overlapping region exists between an orthographic projection of the upper first-type electrode onto the first high-concentration doping region and the first high-concentration doping region,
    wherein an area ratio of the first overlapping region to the first high-concentration doping region falls within a range of 0.5 to 1.5.

10. The micro light emitting diode chip according to claim 1, wherein the first-type electrode comprises an upper first-type electrode disposed on a surface of the second-type semiconductor layer away from the first-type semiconductor layer,
    wherein in a direction perpendicular to the micro light emitting diode chip, a first overlapping region exists between an orthographic projection of the upper first-type electrode onto the first high-concentration doping region and the first high-concentration doping region,
    wherein an area ratio of the first overlapping region to the first high-concentration doping region falls within a range of 0.5 to 1.5.

11. The micro light emitting diode chip according to claim 1, wherein the second-type semiconductor layer has a second high-concentration doping region and a second low-concentration doping region, and the second-type electrode is directly contacted and electrically contacted to the second high-concentration doping region.

12. The micro light emitting diode chip according to claim 11, wherein doping concentration of the second high-concentration doping region falls within a range of $5\times10^{17}$ cm$^{-3}$ to $1\times10^{19}$ cm$^{-3}$.

13. The micro light emitting diode chip according to claim 11, wherein a ratio of an area of an orthographic projection of the second high-concentration doping region along a direction perpendicular to the micro light emitting diode chip to an area of an orthographic projection of the micro light emitting diode chip in the direction falls within a range of 0.01 to 0.35.

14. The micro light emitting diode chip according to claim 11, wherein a ratio of an area of an orthographic projection of a second contact region in a direction perpendicular to the micro light emitting diode chip to an area of the second high-concentration doping region falls within a range of 0.5 to 1, and the second contact region is a contact range of the second-type electrode and the second high-concentration doping region.

15. The micro light emitting diode chip according to claim 11, wherein the second-type electrode comprises an upper second-type electrode disposed on a surface of the second-type semiconductor layer away from the first-type semiconductor layer, wherein a second overlapping region exists between an orthographic projection of the upper second-type electrode in a direction perpendicular to the micro light emitting diode chip and the second high-concentration doping region, wherein an area ratio of the second overlapping region to the second high-concentration doping region falls within a range of 0.5 to 1.5.

\* \* \* \* \*